United States Patent
Schulz

(10) Patent No.: US 10,333,735 B2
(45) Date of Patent: Jun. 25, 2019

(54) ELECTRONIC CIRCUIT FOR CONTROLLING AN ACTUATOR

(71) Applicant: IFM ELECTRONIC GMBH, Essen (DE)

(72) Inventor: Jörg Schulz, Tettnang (DE)

(73) Assignee: IFM ELECTRONIC GMBH, Essen (DE)

(*) Notice: Subject to any disclaimer, the term of this patent is extended or adjusted under 35 U.S.C. 154(b) by 215 days.

(21) Appl. No.: 15/311,464

(22) PCT Filed: Apr. 8, 2015

(86) PCT No.: PCT/EP2015/057619
§ 371 (c)(1),
(2) Date: Nov. 15, 2016

(87) PCT Pub. No.: WO2015/172942
PCT Pub. Date: Nov. 19, 2015

(65) Prior Publication Data
US 2017/0085394 A1      Mar. 23, 2017

(30) Foreign Application Priority Data
May 15, 2014   (DE) .......................... 10 2014 209 204

(51) Int. Cl.
*H03K 5/04* (2006.01)
*E05F 15/00* (2015.01)
(Continued)

(52) U.S. Cl.
CPC ........ *H04L 12/40045* (2013.01); *E05F 15/00* (2013.01); *H03K 3/0377* (2013.01);
(Continued)

(58) Field of Classification Search
CPC ...... H04L 12/40; H03K 3/0377; H03K 3/037; H03K 19/21; E05F 15/00; F42C 15/40;
(Continued)

(56) References Cited

U.S. PATENT DOCUMENTS

| 3,660,690 A | * | 5/1972 | Theodore | ............. H03K 3/2823 327/172 |
| 4,262,222 A | * | 4/1981 | Bjorke | ................... H03K 5/135 327/142 |

(Continued)

FOREIGN PATENT DOCUMENTS

| DE | 102004057787 | 6/2006 |
| EP | 1061703 | 12/2000 |

(Continued)

OTHER PUBLICATIONS

International Search Report and Written Opinion Form PCT/ISA/220, International Application No. PCT/EP2015/057619, pp. 1-12, International Filing Date Aug. 4, 2015, mailing date of search report dated Sep. 7, 2015.

*Primary Examiner* — Jagdeep S Dhillon
(74) *Attorney, Agent, or Firm* — Bond Schoeneck & King, PLLC; George McGuire

(57) ABSTRACT

The present invention provides an electronic circuit for controlling an actuator comprising a transceiver unit (1) for a bus system the bus terminal (2) of which has a monostable behavior with an active period of greater than 1 ms, wherein the transceiver unit (1) is controlled by a microcontroller (3), wherein the monostable behavior of the transceiver unit (1) is switched off with additionally superimposed control pulses, wherein the time interval between two control pulses is smaller than the monostable active period of the transceiver unit (1) and the control pulses are generated by temporal combination of two control signals the time resolution of which is lower than the pulse duration of the (Continued)

control pulses derived therefrom, which is implemented by use of a RC combination (4) and/or a logic gate (6) with a differentiating or delaying effect.

15 Claims, 4 Drawing Sheets

(51) Int. Cl.
   *H03K 19/21* (2006.01)
   *H03K 3/037* (2006.01)
   *H04L 12/40* (2006.01)
   *H03K 5/1534* (2006.01)

(52) U.S. Cl.
   CPC ............ *H03K 5/04* (2013.01); *H03K 5/1534* (2013.01); *H03K 19/21* (2013.01); *E05Y 2900/546* (2013.01)

(58) Field of Classification Search
   CPC . H02J 3/02; H05B 37/02; B60L 11/00; B60R 16/023; B60R 16/03
   USPC ......................................................... 307/10.1
   See application file for complete search history.

(56) References Cited

U.S. PATENT DOCUMENTS

| | | | | | |
|---|---|---|---|---|---|
| 4,627,090 | A | * | 12/1986 | Smith, III | G10L 21/00 704/205 |
| 4,860,653 | A | * | 8/1989 | Abouav | F42B 3/122 102/200 |
| 5,469,150 | A | * | 11/1995 | Sitte | G05B 19/054 340/3.1 |
| 6,438,462 | B1 | * | 8/2002 | Hanf | G06F 1/3203 340/693.4 |
| 9,975,502 | B2 | * | 5/2018 | Mijac | B60R 16/023 |
| 2006/0100759 | A1 | * | 5/2006 | Horbelt | H04L 12/40 701/36 |
| 2011/0241847 | A1 | * | 10/2011 | Baruco | B60R 25/245 340/12.5 |
| 2013/0181630 | A1 | * | 7/2013 | Taipale | H05B 37/0263 315/224 |
| 2015/0039801 | A1 | * | 2/2015 | Mori | G06F 13/4072 710/305 |
| 2015/0188237 | A1 | * | 7/2015 | Apostolos | H01Q 21/068 343/824 |

FOREIGN PATENT DOCUMENTS

| | | |
|---|---|---|
| EP | 2571200 | 3/2013 |
| JP | S56159721 | 12/1981 |

* cited by examiner

ELECTRONIC CIRCUIT FOR CONTROLLING AN ACTUATOR

The invention relates to an electronic circuit for operating an actuator according to the preamble of claim 1 and in particularly a tailgate control for a motor vehicle. Here too, bus systems offer a cost-efficient and not only for this reason widespread possibility for data transmission.

One possibility for the realization of mixed networks of sensors and actuators in the comfort zone of modern motor vehicles is the LIN (Local Interconnect Network) bus. This is a generally star-shaped configured single-wire bus, which is particularly advantageous when only little bandwidth is required and other solutions are oversized.

In terms of cost optimization one wants to use modules developed for this bus in larger quantities and thus partially apart from their intended use, namely for controlling actuators, for example, for opening a tailgate and as a simple electronic switch without bus functionality.

However, this is in contradiction to a characteristic which is important for reasons of interference immunity, namely the automatic shutdown of the transmitter stage after of more than 1 ms (timeout) which is hereinafter referred to as monostable behaviour. Thus, the known transmitter-receiver units (transceivers) are unsuitable for these applications. This problem seems to be solvable by use of additional control pulses during the active period of the transceiver.

DE 10 2004 057 787 A1 discloses a module and a method which is also suitable for operating a LIN bus system, wherein the module receives special control signals via the LIN bus line, which normally are not provided in the bus system protocol. Control signals are proposed which are shorter than the minimum pulse duration Tmin of more than 1 ms, typically 20 ms and less than 50 ms, defined in the LIN bus protocol.

The question remains, how considerably shorter control signals can be produced reliably and, thus, safe in operation by use of the hardware associated to the LIN bus, i.e. the LIN bus control.

DE 10 2004 037 683 B4 discloses an arrangement for short-circuit detection, wherein the supply voltage is briefly interrupted by test pulses. The operation is maintained by intermediate buffering the operating voltage.

However the additional control pulses should have a pulse duration of less than 1 µs, because otherwise the output stage of the LIN transceiver can already respond to the control pulses, which is not desirable. By use of the control pulses only the monostable behaviour should be suppressed without any response of the output stage resulting in a possible disturbance of other bus participants. The LIN bus control is usually not designed for generating pulses with such a short duration.

It is the object of the invention to overcome this disadvantage. In particular, an arrangement is to be provided, which enables the use of a conventional transceiver unit, here a LIN transceiver, for controlling an actuator in a motor vehicle and as a simple electronic switch without bus functionality.

The object of the invention is achieved by the characterizing features of claim 1. The dependent claims relate to the advantageous embodiment of the invention.

The essential idea of the invention is to obtain both the LIN data to be transmitted in the LIN mode and the switch signals for the switch modus including the short control pulses required for suppressing the monostable function by functional combination of two control signals, which in principle have a too short time resolution for the production of the short control pulses, considerably more than 1 µs.

The short time constant required for the production of the short control pulses, thus, according to the invention is realized by an RC combination with differentiating or integrating, i.e. delaying action or also by the propagation delay time of logic gates.

The advantage of the invention is that the duration of the control pulses is not bound to the clock frequency of the controlling microcontroller. Furthermore, even shorter control signals (e.g. 20 ns) offer additional security against an undesirable behaviour of the LIN transceiver. The signal patterns required for each specific solution can be easily derived by a person skilled in the art from the logical transfer function of the circuit according to the invention.

The invention will be explained in more detail with reference to the drawings.

Figure 1:
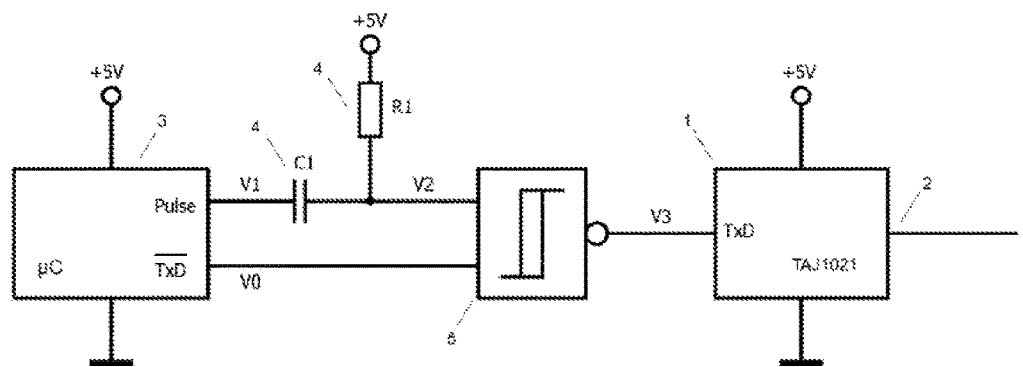
FIG. 1 shows an embodiment with a differentiating RC combination and trigger.

FIG. 1 shows an arrangement with a UN transceiver of type TAJ1021, which is controlled by a microcontroller 3. An actuator (not shown), for example, the drive for the tailgate of a motor vehicle is controlled via the bus connection 2. Since the LIN transceiver has the above-described monostable behaviour with an active period of 5 to 100 ms, it is controlled by a switching signal which is superimposed by control pulses shorter than 1 µs.

The control pulses of less than 1 µs according to the invention are obtained at the combination designated by R1, C1 by differentiating the pulse signal produced by the microcontroller 3, which has a significantly lower frequency. The pulse signal V1 has a time resolution which is too low to produce such short control pulses directly. The time resolution in the sense of the present invention means the smallest time step width of the respective output signal which can be achieved with the microcontroller in the respectively used hardware and software configuration. This time step width for example depends on the clock frequency of the microcontroller. A trigger 5, e.g. a NAND gate of the type CD4093 serves to link the signals V0 and V2 and as a threshold switching stage.

Figure 2:
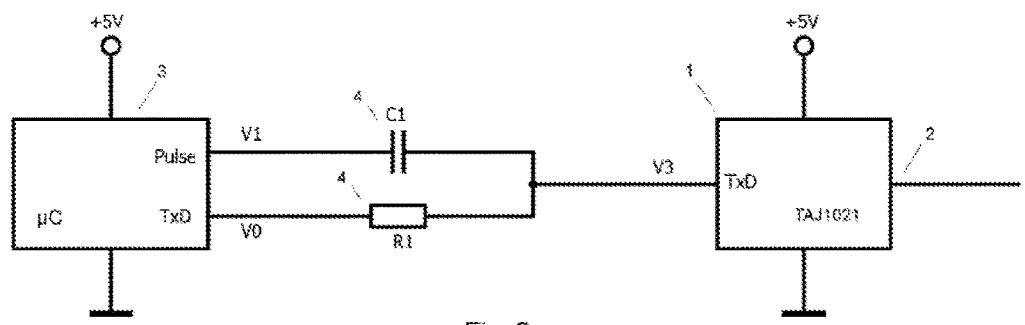
FIG. 2 shows an embodiment with a microprocessor controlled RC combination.

FIG. 2 shows an arrangement with the same LIN transceiver, but without trigger or threshold switch 5. Here, the two signals V0 and V1 are directly superimposed. The pulse signal V1 is differentiated at the capacitor C1, such that the required short pulse durations are produced. Here, the input stage of the LIN transceiver acts itself as a trigger, wherein this term according to the invention should encompass all kinds of threshold sensitive switching stages (threshold switching states). The signal V0 at the terminal TxD of the µC has to be non-inverting in order to meet the function TxD at the UN transceiver (V3).

Figure 3:
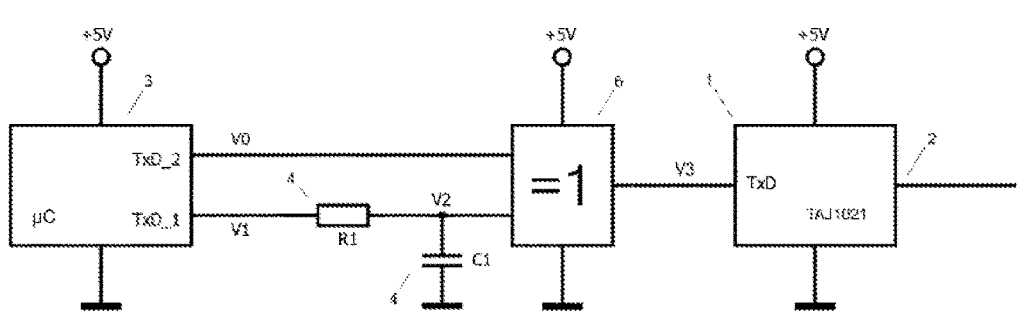
FIG. 3 shows an embodiment with an integrating RC combination and logic gate.

FIG. 3 shows an embodiment with an integrating RC combination R1, C1 and a XOR logic gate, for example CD4030, controlled by the microcontroller 3.

Figure 4:
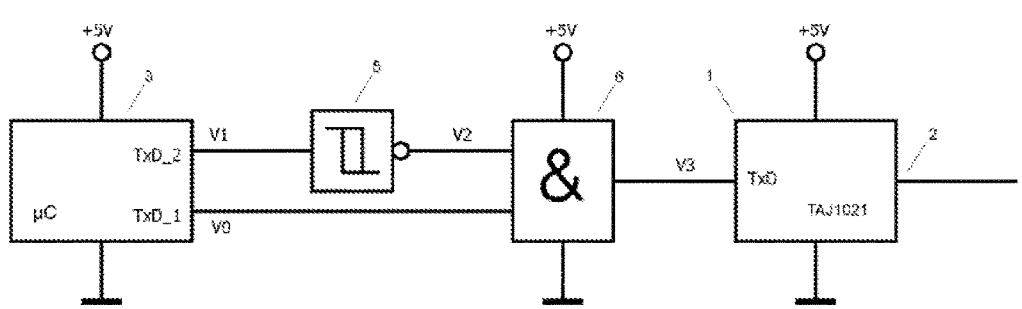
FIG. 4 shows an embodiment based on a propagation delay time of a logic gate and comprising a trigger.

FIG. 4 shows an embodiment based on the propagation delay time of a logic gate CD7414. The logic gate is in this case an inverting Schmitt trigger 5, the propagation delay time of which serves for a time shifted controlling of the two inputs of the AND gate 6, e.g. CD4081.

Figure 5:
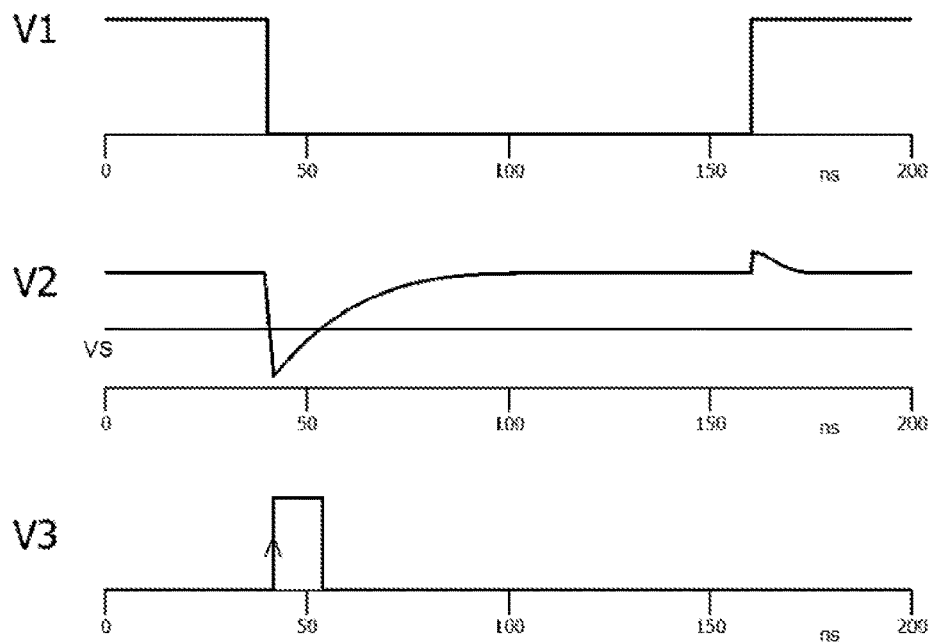
FIG. 5 shows an example of a signal pattern of an embodiment according to FIG. 1.

FIG. 5 shows an example of a signal pattern of an embodiment according to FIG. 1. The switching signal V0 in FIG. 1 has the logic state "High" and is not shown here.

Figure 6:
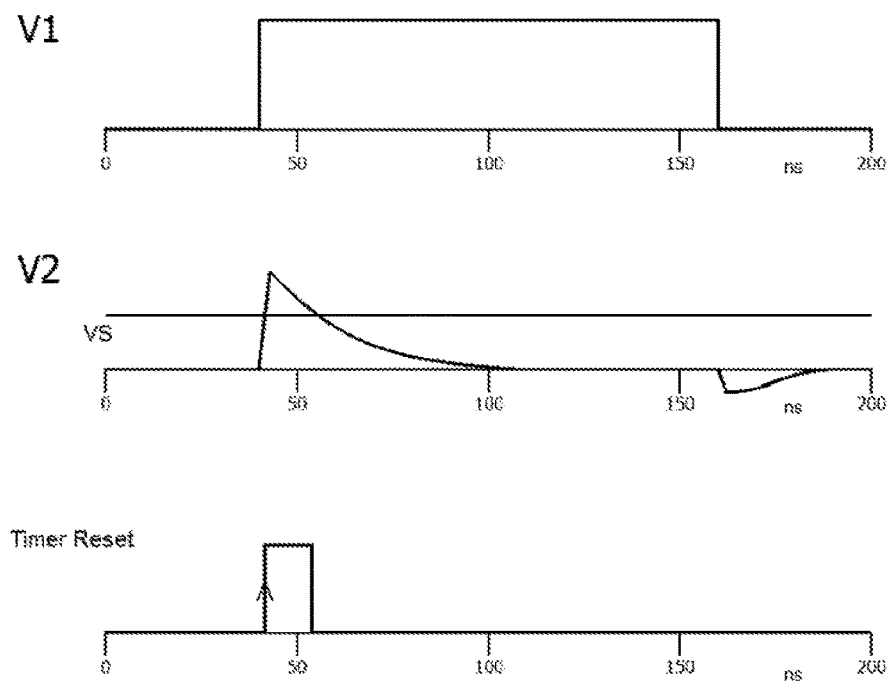
FIG. 6 shows an example of a signal pattern of an embodiment according to FIG. 2.

FIG. 6 shows an example of a signal pattern (pulse diagram) of a configuration according to FIG. 2. The switching signal V0 of FIG. 2 has in this example the logical state "Low" and is not shown in FIG. 6.

If the electronic circuit according to the invention is used in a sensor of a motor vehicle, it can either pass the sensor information via a bus or control an actuator via a control unit or control an actuator directly.

It is state of the art to connect control units via bus systems with intelligent sensors and actuators in motor vehicles. Known bus systems in the automotive sector are the CAN bus and the aforementioned LIN bus. In this case, the LIN bus that operates according to the master-slave principle, is often used for simpler control tasks. The control units operating as a LIN master are usually further connected via the CAN bus to the central board communication network of the motor vehicle.

As one example a rain sensor can be mentioned, which is connected to a LIN control device for the wiper motor that controls the wiper motor. Via the board communication network also additional current informations about the speed can be provided to this LIN controller. Thus, the wiping speed can be adapted to the vehicle speed. Alternatively, control units and actuators can be connected directly to sensors. In this case the sensor does not transmit its information to the control device via a data packet according to the bus protocol, but in a much simpler way, e.g. as a simple binary state signal which characterizes two states of the sensor (e.g. ON/OFF). This signal transmitted via a switching signal interface is also referred to as a switching signal. Here, as an example an engine cover sensor can be mentioned that detects whether the engine cover is open or closed.

Different control devices expect switching signals of different lengths. The state signal may, for example, be generated by a switching transistor which is controlled by a microcontroller. In order to meet all safety requirements in the motor vehicle, certain precautions are necessary. The same applies to the direct control of an actuator.

Depending on the respective control device the sensors require a correspondingly adapted interface, either a bus interface or a switching signal interface, in order to be able to transmit the required information. In order to cover all alternatives of control devices it is conceivable to provide a sensor with two interfaces, a bus interface and a switching signal interface. The additional switching signal interface requires electronic safeguards that meet the strict safety requirements in motor vehicles. Here overtemperature protection, over voltage protection, short circuit protection, reverse polarity protection etc. may be mentioned. This possibility is, however, very complicated and expensive. In particular in the automotive sector savings in the cent range are of great significance.

It is therefore another object of the invention to provide a sensor for a motor vehicle which is suitable for various control devices with bus interface or switching signal interface, which is simple and inexpensive to produce and which meets certain safety regulations especially in the automotive sector.

Figure 7:
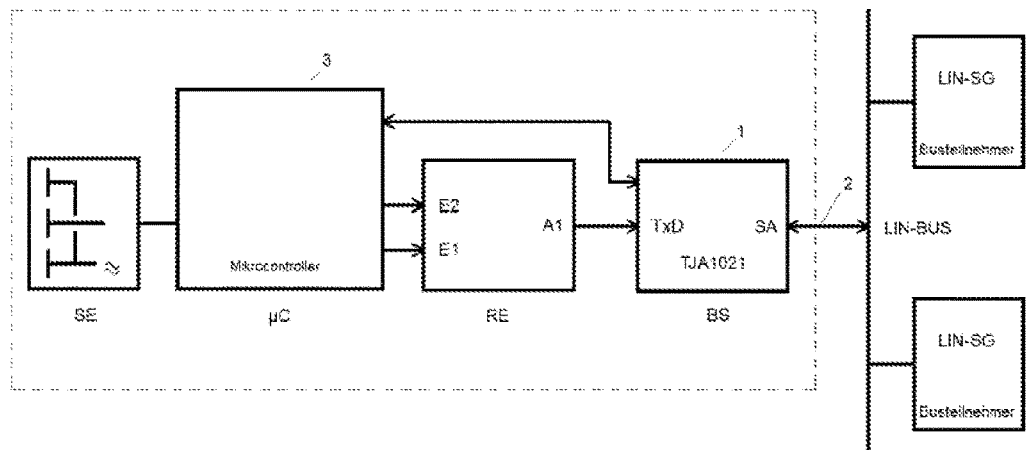
FIGS. 7 to 9 show a sensor according to the invention with different interfaces.

FIG. 7 shows such a sensor according to the invention. The sensor for a motor vehicle, outlined in phantom, comprises a sensor element SE for detecting a physical measured variable and converting it into an electrical signal. The sensor element SE may, for example, be the transducer of a capacitive door handle sensor or a tailgate sensor.

In a microcontroller ($\mu$C) which is supplied with the electrical signal of the sensor element SE depending on the evaluation of the physical measured variable a binary state information may be generated, which is intended for a control device (LIN) SG in the vehicle.

This state information is forwarded via a bus module BS, e.g. the LIN bus transceiver TJA1021, to the LIN control device SG. As is known, the bus module BS serves for adaptation to the physical transmission layer of the used bus system, in this case to the LIN bus.

This bus module BS has a timeout with a timeout period of e.g. 10 milliseconds. This timeout prevents, that the BS bus module outputs a continuous signal which disturbs the communication on the bus.

According to the invention the microcontroller $\mu$C and the bus module BS are connected to each other via a reset pulse generator unit RE.

The structure of the reset pulse generator unit RE is described in more detail with respect to the FIGS. 1-4.

The reset pulse generator unit RE comprises two inputs E1, E2 at the microcontroller side and an output A1 at the bus module side, wherein the input E2 of the reset pulse generator unit RE may serve e.g. as a trigger input for generating a reset pulse. A corresponding circuit is shown in FIGS. 1 and 2.

The duration of a reset pulse is so short that on the one hand the reset pulse is not transmitted from the bus module BS, but on the other hand the timeout process is restarted. Thus, a continuous signal may be generated at the output of the bus module BS, which is longer than the timeout period of the bus module.

If the trigger input E2 is not controlled, no reset pulses are generated and the protocol data supplied from the microcontroller $\mu$C are forwarded unchanged from the reset pulse generator unit RE and transmitted from the bus module BS via the LIN bus to the LIN control device.

Figure 8:
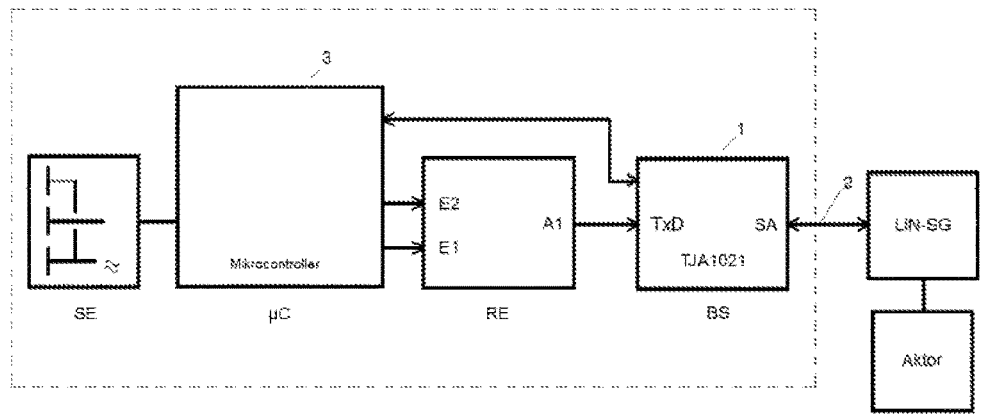

By means of a simple circuit supplement, the reset pulse generator unit RE, the sensor can either communicate via the LIN bus with a LIN bus control device or alternatively transmit its state information represented as a switching signal as shown in FIG. 8 directly to a control device SG comprising a switching input. These two variants require only a corresponding adaptation of the software in the microcontroller $\mu$C.

Since the bus module BS satisfies all electronic safeguards for the automotive sector, no special safeguards are required in the switching signal variant. Thus, the sensor can be produced very cost-efficient.

In a further implementation of the invention only the components for the reset pulse generator unit RE are not provided for the switching signal variant. The layout for the electronics board on which the microcontroller, the bus module BS and other components are provided is identical in both cases, i.e. bus interface, switching signal interface. Thus, the component costs for the reset pulse generator unit RE may be saved.

Figure 9:
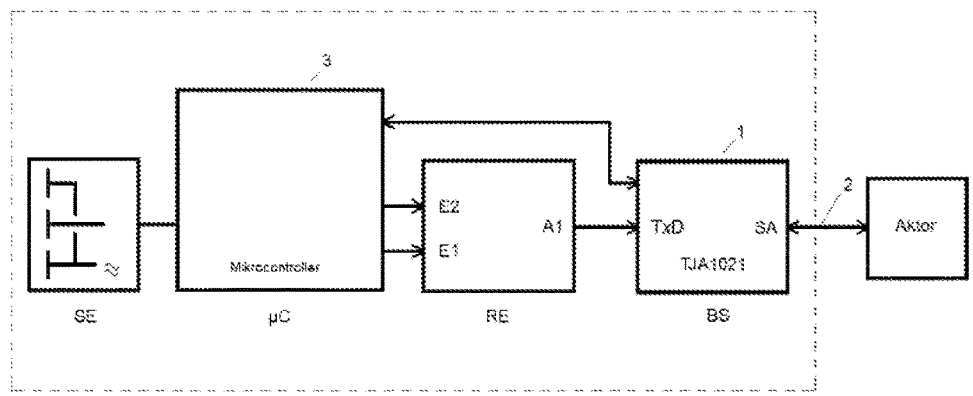

FIG. 9 shows the sensor according to the invention which directly controls an actuator. The final stage which powers the output 2 of the bus module BS supplies approximately 70 mA. This is sufficient to control an actuator such as a relay or a small electric motor directly. Even a LED serving for signaling can be controlled directly. More powerful electric motors must be controlled via a relay or a switching transistor.

Figure 10:
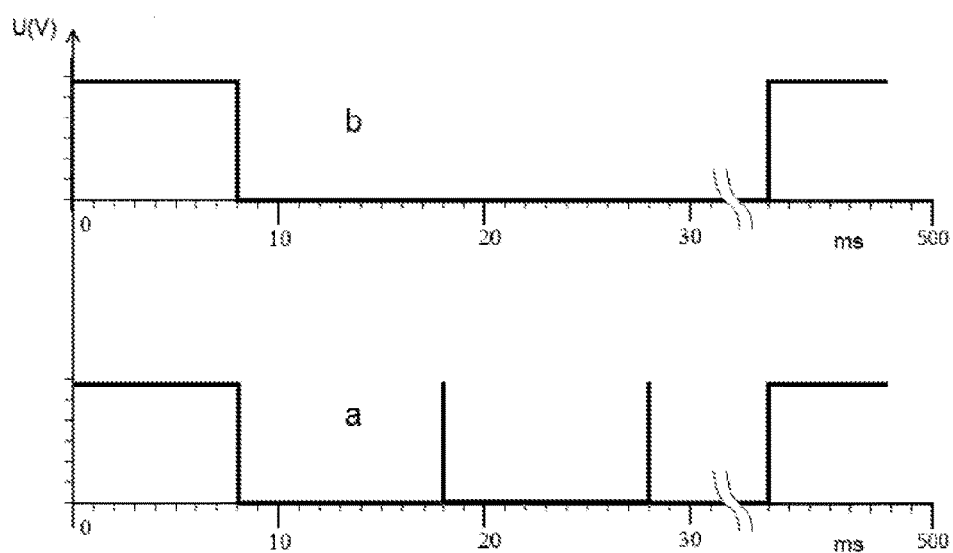
FIG. 10 shows the input and output signal of a bus module BS operated according to the invention.

FIG. 10 shows in the lower diagram designated by "a" the signal at the input TxD of the bus module BS with the respective reset pulses. The ordinate indicates a voltage. In the upper diagram 10 designated by "b" FIG. 10 shows the corresponding signal at the output 2 of the bus module BS. It exhibits no ripples or "glitches".

REFERENCE SYMBOLS

1 LIN transceiver
2 bus terminal of the LIN transceiver
3 microcontroller (μC)
4 RC combination with differentiating effect
5 (Schmitt) trigger, threshold switching stage, e.g. CD7414
6 logic gate, e.g. CD4093, CD4030 or CD4081

The invention claimed is:

1. Electronic circuit for controlling an actuator comprising a transceiver unit for a bus system, the bus terminal of which has a monostable behaviour with an active period of more than 1 millisecond, wherein the transceiver unit is controlled by a microcontroller, wherein the monostable behaviour of the bus terminal is switched off by additional control pulses, wherein the time interval between two control pulses is smaller than the monostable active period of the transceiver unit, wherein the control pulses are formed by temporal combination of two control signals, whose time resolutions are lower than the pulse duration of the control pulses derived therefrom, wherein the time resolution is the smallest time step width of the corresponding output signal which is achievable with the microcontroller in a respectively used hardware and software configuration, wherein the TxD terminal of the transceiver unit is connected to a resistor R1 and a capacitor C1, wherein the second terminal of the resistor R1 is supplied with the switching signal and the second terminal of the capacitor C1 is supplied with a pulse signal.

2. Electronic circuit according to claim 1, characterized in that the transceiver unit comprises a LIN transceiver.

3. Electronic circuit according to claim 1, characterized in that the pulse length of the control pulses is smaller than 1 μs.

4. Electronic circuit according to claim 1, characterized in that the duty cycle of the control pulses is less than 1%.

5. Electronic circuit according to claim 1, characterized in that the control pulses are generated by a differentiating RC combination and a downstream trigger, wherein the TxD terminal of the transceiver unit is connected to the output of the trigger.

6. Electronic circuit according to claim 1, characterized in that the control pulses are generated by an integrating RC combination with a downstream trigger, wherein the TxD terminal of the transceiver unit is connected to the output of the trigger.

7. Electronic circuit according to claim 1, characterized in that the control pulses are generated with at least one logic gate by utilizing the gate's propagation delay time and the TxD terminal of the transceiver unit is connected to the output of the arrangement.

8. Actuator in a motor vehicle, in particular for actuating a tailgate which includes an electronic circuit comprising a transceiver unit for a bus system, the bus terminal of which has a monostable behaviour with an active period of more than 1 millisecond, wherein the transceiver unit is controlled by a microcontroller, wherein the monostable behaviour of the bus terminal is switched off by additional control pulses, wherein the time interval between two control pulses is smaller than the monostable active period of the transceiver unit characterized in that the control pulses are formed by temporal combination of two control signals, whose time resolutions are lower than the pulse duration of the control pulses derived therefrom, wherein the time resolution is the smallest time step width of the corresponding output signal which is achievable with the microcontroller in a respectively used hardware and software configuration wherein the TxD terminal of the transceiver unit is connected to a resistor R1 and a capacitor C1, wherein the second terminal of the resistor R1 is supplied with the switching signal and the second terminal of the capacitor C1 is supplied with a pulse signal.

9. Sensor for a motor vehicle comprising a sensor element for detecting a physical measured variable and for converting it into an electrical signal comprising a microcontroller which is supplied with the electrical signal and which depending on the value of the physical measured variable generates binary state information which is intended for a control unit in the vehicle, wherein the state information is forwarded to the control device via a bus module, wherein the bus module serves for adaptation to the physical transmission layer of a bus system and comprises a timeout with a hardware-related timeout period which prevents that the bus module outputs a continuous signal which disturbs the communication on the bus, characterized in that the microcontroller and the bus module are connected to each other via a reset pulse generator unit, which on the microcontroller side comprises two inputs and on the bus module side comprises an output, wherein by means of the reset pulse generator unit reset pulses can be generated which are temporally so short, that they are on the one hand not transmitted from the bus module and on the other hand respectively restart the timeout process, such that at the output of the bus module a continuous signal can be generated which is longer than the timeout period.

10. Electronic circuit for controlling an actuator comprising a transceiver unit for a bus system, the bus terminal of which has a monostable behaviour with an active period of more than 1 millisecond, wherein the transceiver unit is controlled by a microcontroller, wherein the monostable behaviour of the bus terminal is switched off by additional control pulses, wherein the time interval between two control pulses is smaller than the monostable active period of the transceiver unit, characterized in that
wherein the control pulses are formed by temporal combination of two control signals, whose time resolutions are lower than the pulse duration of the control pulses derived therefrom, wherein the time resolution is the smallest time step width of the corresponding output signal which is achievable with the microcontroller in a respectively used hardware and software configuration wherein the control pulses are generated by one of:
(a) a differentiating RC combination and a downstream trigger, wherein the TxD terminal of the transceiver unit is connected to the output of the trigger,
(b) an integrating RC combination with a downstream trigger, wherein the TxD terminal of the transceiver unit is connected to the output of the trigger (c) at least one logic gate by utilizing the gate's propagation delay time and the TxD terminal of the transceiver unit is connected to the output of the arrangement.

11. Electronic circuit according to claim 10, characterized in that the transceiver unit comprises a LIN transceiver.

12. Electronic circuit according to claim 10, characterized in that the pulse length of the control pulses is smaller than 1 μs.

13. Electronic circuit according to claim 10, characterized in that the duty cycle of the control pulses is less than 1%.

14. Electronic circuit according to claim 10, characterized in that the TxD terminal of the transceiver unit is connected to a resistor R1 and a capacitor C1, wherein the second terminal of the resistor R1 is supplied with the switching signal and the second terminal of the capacitor C1 is supplied with a pulse signal.

15. Actuator in a motor vehicle, in particular for actuating a tailgate which includes an electronic circuit comprising a transceiver unit for a bus system, the bus terminal of which has a monostable behaviour with an active period of more than 1 millisecond, wherein the transceiver unit is controlled by a microcontroller, wherein the monostable behaviour of the bus terminal is switched off by additional control pulses, wherein the time interval between two control pulses is smaller than the monostable active period of the transceiver unit characterized in that the control pulses are formed by temporal combination of two control signals, whose time resolutions are lower than the pulse duration of the control pulses derived therefrom, wherein the time resolution is the smallest time step width of the corresponding output signal which is achievable with the microcontroller in a respectively used hardware and software configuration wherein the control pulses are generated by one of:

(a) a differentiating RC combination and a downstream trigger, wherein the TxD terminal of the transceiver unit is connected to the output of the trigger, (b) an integrating RC combination with a downstream trigger, wherein the TxD terminal of the transceiver unit is connected to the output of the trigger (c) at least one logic gate by utilizing the gate's propagation delay time and the TxD terminal of the transceiver unit is connected to the output of the arrangement.

* * * * *